(12) United States Patent
Lien et al.

(10) Patent No.: US 9,349,859 B1
(45) Date of Patent: May 24, 2016

(54) TOP METAL PADS AS LOCAL INTERCONNECTORS OF VERTICAL TRANSISTORS

(71) Applicant: Taiwan Semiconductor Manufacturing Company, Ltd., Hsin-Chu (TW)

(72) Inventors: Wai-Yi Lien, Hsin-Chu (TW); Yi-Hsun Chiu, Zhubei (TW); Jia-Chuan You, Dayuan Township (TW); Yu-Xuan Huang, Hsin-Chu (TW); Chih-Hao Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/608,958

(22) Filed: Jan. 29, 2015

(51) Int. Cl.
| H01L 29/66 | (2006.01) |
| H01L 29/78 | (2006.01) |
| H01L 27/092 | (2006.01) |
| H01L 21/8238 | (2006.01) |
| H01L 23/535 | (2006.01) |
| H01L 29/786 | (2006.01) |

(52) U.S. Cl.
CPC .... *H01L 29/7827* (2013.01); *H01L 21/823871* (2013.01); *H01L 21/823885* (2013.01); *H01L 23/535* (2013.01); *H01L 27/092* (2013.01); *H01L 29/78642* (2013.01)

(58) Field of Classification Search
CPC ................ H01L 21/82285; H01L 29/78642; H01L 29/7827
USPC ......................................................... 257/329
See application file for complete search history.

(56) References Cited

U.S. PATENT DOCUMENTS

| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |

(Continued)

*Primary Examiner* — David Vu
*Assistant Examiner* — Brandon Fox
(74) *Attorney, Agent, or Firm* — Slater Matsil, LLP

(57) ABSTRACT

An integrated circuit structure includes a first vertical transistor and a second vertical transistor. The first vertical transistor includes a first semiconductor channel, a first top source/drain region over the first semiconductor channel, and a first top source/drain pad overlapping the first top source/drain region. The second vertical transistor includes a second semiconductor channel, a second top source/drain region over the second semiconductor channel, and a second top source/drain pad overlapping the second top source/drain region. A local interconnector interconnects the first top source/drain pad and the second top source/drain pad. The first top source/drain pad, the second top source/drain pad, and the local interconnector are portions of a continuous region, with no distinguishable interfaces between the first top source/drain pad, the second top source/drain pad, and the local interconnector.

20 Claims, 22 Drawing Sheets

(56) References Cited

U.S. PATENT DOCUMENTS

| | | |
|---|---|---|
| 8,841,701 B2 | 9/2014 | Lin et al. |
| 8,847,293 B2 | 9/2014 | Lee et al. |
| 8,853,025 B2 | 10/2014 | Zhang et al. |
| 2004/0113207 A1 | 6/2004 | Hsu et al. |
| 2007/0010078 A1 | 1/2007 | Juengling |
| 2010/0270611 A1* | 10/2010 | Masuoka et al. ............ H01L 21/823885 257/329 |
| 2011/0062515 A1 | 3/2011 | Masuoka et al. |
| 2011/0068407 A1 | 3/2011 | Yeh et al. |
| 2013/0011983 A1 | 1/2013 | Tsai et al. |
| 2014/0252412 A1 | 9/2014 | Tsai et al. |

* cited by examiner

TOP METAL PADS AS LOCAL INTERCONNECTORS OF VERTICAL TRANSISTORS

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having vertical gate-all-around structures were also developed, wherein the respective transistors are also referred to as Vertical Gate All Around (VGAA) transistors. In a VGAA transistor, a gate dielectric and a gate electrode fully encircle a channel region. This configuration delivers a good control of the channel, and the short-channel effects are reduced.

The connection to the source and drain regions of the VGAA transistors is through contact plugs and metal lines. Contact plugs are formed to electrically connect to the top source/drain regions, the bottom source/drain regions, and the gates of the VGAA transistors. Metal lines are used to interconnect the contact plugs. When a local interconnector is needed to electrically interconnect the top source/drain regions of neighboring VGAA transistors, the local interconnector includes the contact plugs and the metal line interconnecting the contact plugs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
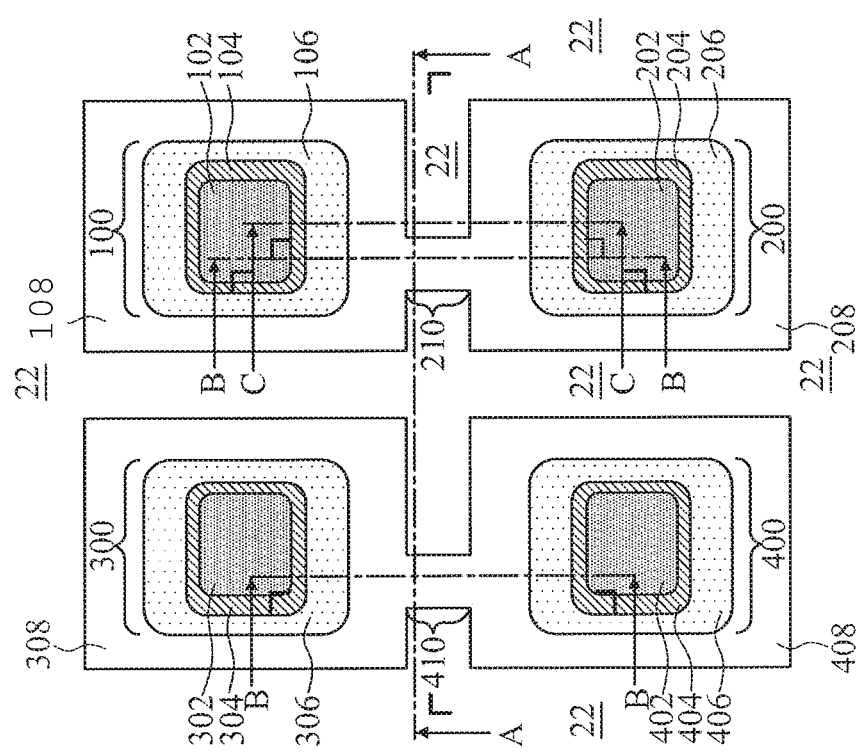
FIG. 1 illustrates a top view of neighboring Vertical Gate All Around (VGAA) transistors and the local interconnector for connecting neighboring VGAA transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A local interconnector for interconnecting the top source/drain regions of Vertical Gate All Around (VGAA) transistors and the method of forming the same are provided in accordance with various exemplary embodiments. The intermediate stages of forming the local interconnectors are illustrated. The variations of the embodiments are discussed. Throughout the various views and illustrative embodiments, like reference numbers are used to designate like elements.

FIG. 1 illustrates a top view of a plurality of VGAA transistors 100, 200, 300, and 400. In accordance with some embodiments of the present disclosure, VGAA transistors 100 and 300 are n-type vertical transistors, while VGAA transistors 200 and 400 are p-type vertical transistors. VGAA transistors 100 and 200 are interconnected to form a pair, and VGAA transistors 300 and 400 are interconnected to form a pair. In some exemplary embodiments, either one or both of the pair 100/200 and the pair 300/400 is used in a circuit such as an inverter, wherein the drain regions of VGAA transistors 100 and 200 are electrically connected (shorted), and/or the drain regions of VGAA transistors 300 and 400 are electrically connected (shorted).

VGAA transistor 100 includes vertical nanowire 102, which may form the channel region, and possibly portions of the source and/or drain regions, of VGAA transistor 100. Gate dielectric 104 forms a ring encircling the channel region of VGAA transistor 100. Gate electrode 106 further forms a ring encircling gate dielectric 104. Top source/drain pad 108 is over and electrically connected to the top source/drain region 120 (FIG. 2B). Nanowire 102, gate dielectric 104, and gate electrode 106 are illustrated using dashed lines to indicate that they are underlying top source/drain pad 108.

Similarly, VGAA transistor 200 includes vertical nanowire 202, gate dielectric 204, gate electrode 206, and top source/drain pad 208. Gate dielectric 204 forms a ring encircling the channel region of VGAA transistor 200. Gate electrode 206 further forms a ring encircling gate dielectric 204. Top source/drain pad 208 is over and electrically connected to the top source/drain region 220 (FIG. 2B). VGAA transistor 300 includes vertical nanowire 302, gate dielectric 304, gate electrode 306, and top source/drain pad 308. Gate dielectric 304 forms a ring encircling the channel region of VGAA transistor 300. Gate electrode 306 further forms a ring encircling gate dielectric 304. Top source/drain pad 308 is over and electrically connected to the respective top source/drain region (not shown). VGAA transistor 400 includes vertical nanowire 402, gate dielectric 404, gate electrode 406, and top source/drain pad 408. Gate dielectric 404 forms a ring encircling the channel region of VGAA transistor 400. Gate electrode 406 further forms a ring encircling gate dielectric 404. Top source/drain pad 408 is over and electrically connected to the respective top source/drain region (not shown).

Top source/drain pad 108 and top source/drain pad 208 are interconnected by local interconnector 210. In accordance with some embodiments of the present disclosure, top source/drain pads 108 and 208 and local interconnector 210 form a continuous conductive region, with no break and no distinguishable interface in between. Furthermore, top source/drain pads 108 and 208 and local interconnector 210 have the same structure and are formed of the same conductive materials. For example, top source/drain pads 108 and 208 and local interconnector 210 may be formed of a single conductive layer or multiple conductive sub-layers. When including multiple conductive sub-layers, the corresponding sub-layers in top source/drain pads 108 and 208 and local interconnector 210 are formed of the same materials.

Similarly, top source/drain pad 308 and top source/drain pad 408 are interconnected by local interconnector 410, wherein top source/drain pads 308 and 408 and local interconnector 410 form a continuous conductive region, with no break and no distinguishable interface in between.

Figure 12:
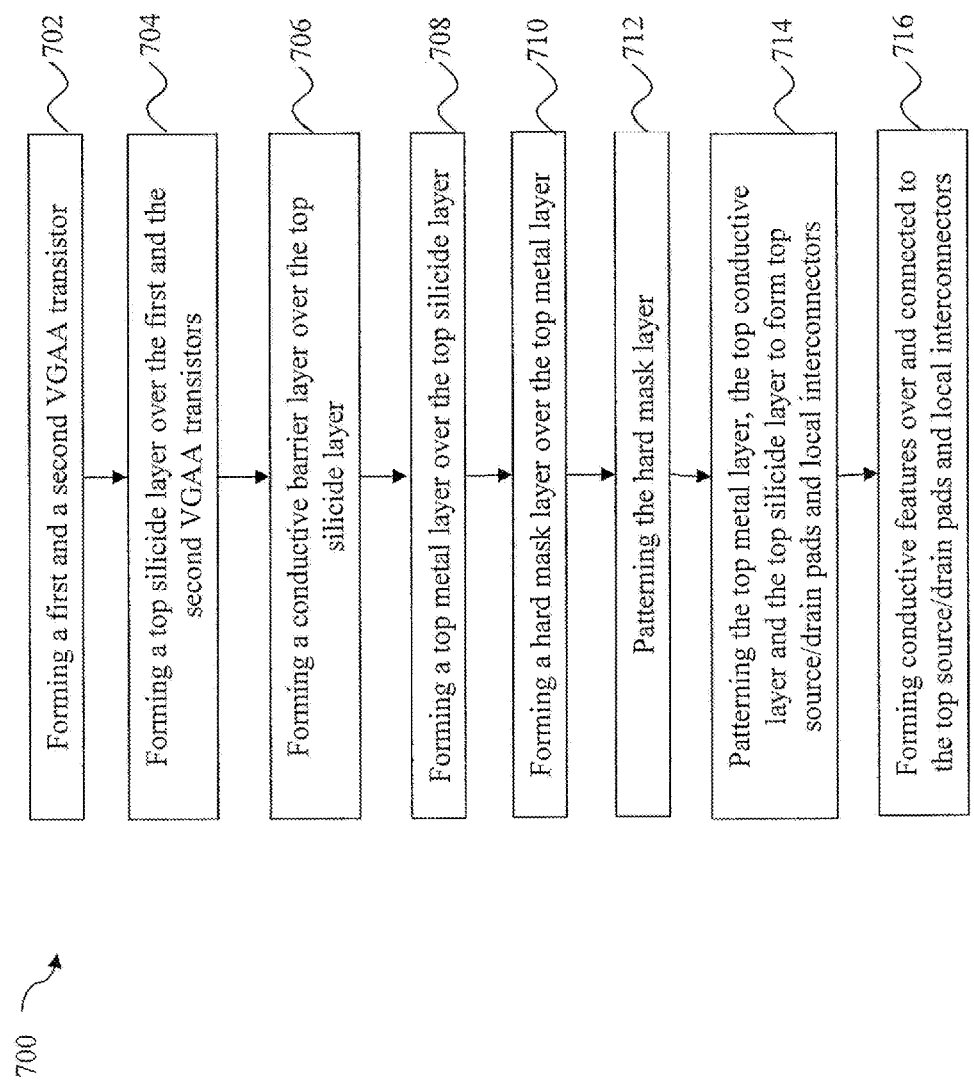
FIG. 12 illustrates the process flow for forming portions of the VGAA transistors and local interconnectors in accordance with some embodiments.

FIGS. 2A through 7C illustrate the cross-sectional views of intermediate stages in the formation of the structure shown in FIG. 1 in accordance with some embodiments. The steps shown in FIGS. 2A through 7C are also illustrated schematically in the process flow shown in FIG. 12. In the subsequent discussion, the process steps shown in FIGS. 2A through 7C are discussed referring to the process steps in FIG. 12.

Each figure number in FIGS. 2A through 7C includes a number followed by a letter "A," "B," or "C." The figures include letter "A" illustrate the cross-sectional views obtained from the plane containing line A-A in FIG. 1. The figures include letter "B" illustrate the cross-sectional views obtained from the plane containing line B-B in FIG. 1. The figures include letter "C" illustrate the cross-sectional views obtained from the plane containing line C-C in FIG. 1. FIGS. 2A through 7C illustrate the cross-sectional views of VGAA transistors 100 and 200. In addition, FIG. 1 also illustrates line B'-B', whose plane passes VGAA transistors 300 and 400. The cross-sectional views obtained from the plane containing line B'-B' may be essentially the same as the cross-sectional views shown in the plane containing line B-B. Hence, the cross-sectional views obtained from the plane containing line B'-B' are not illustrated, and may be found from the figures whose numbers include letter "B."

Figure 2A:
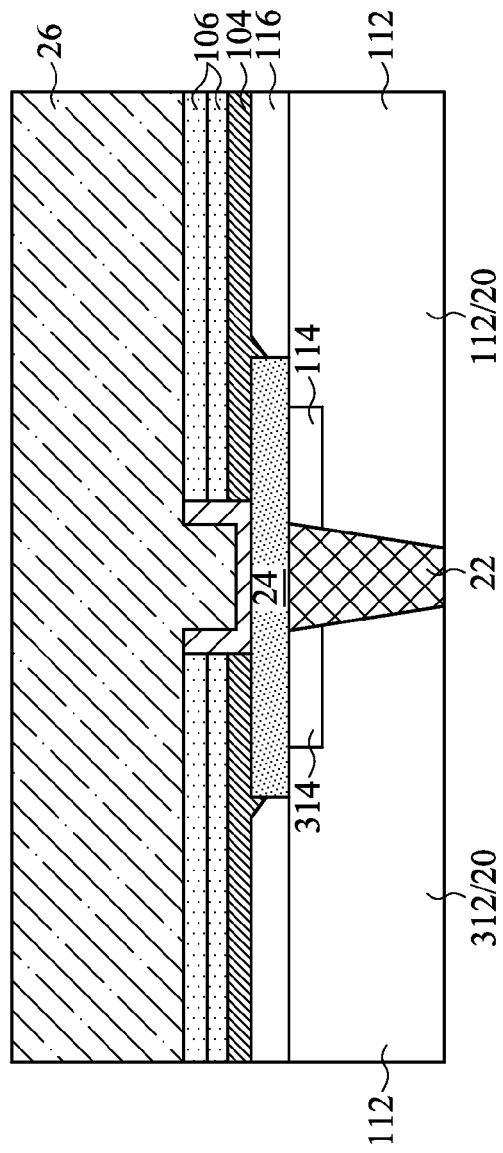
FIGS. 2A through 7C illustrate the cross-sectional views of intermediate stages in the formation of the local interconnectors of VGAA transistors in accordance with some embodiments.
Figure 2B:
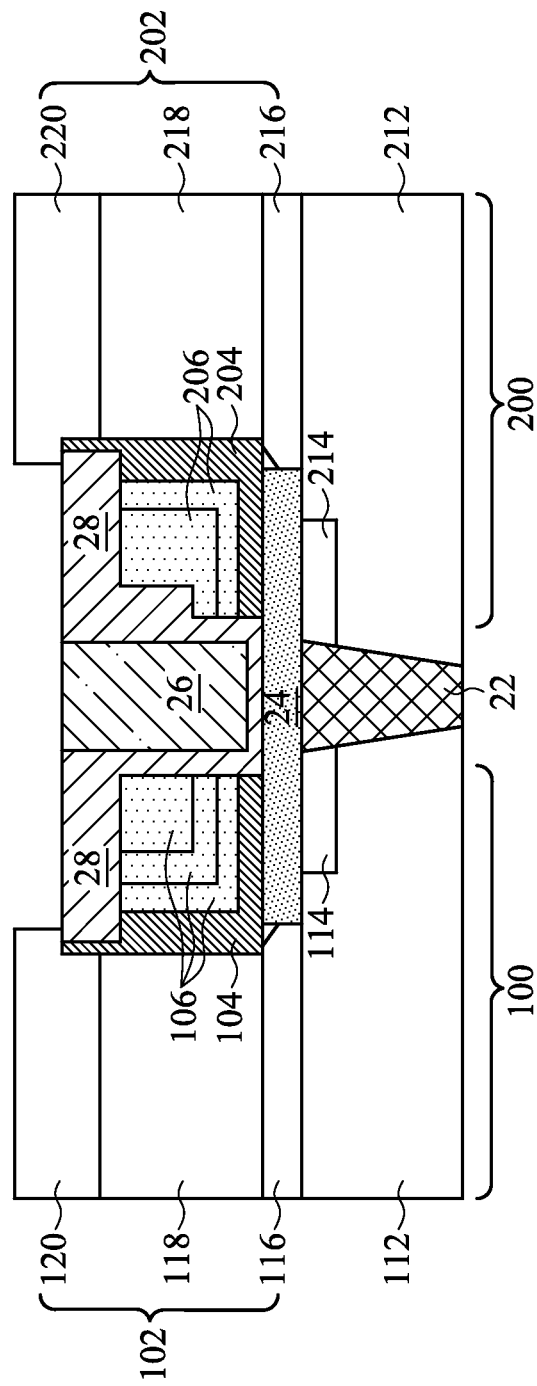

FIG. 2A illustrates a cross-sectional view in the formation of an initial structure, wherein the cross-sectional view is obtained from the plane containing line A-A in FIG. 1. Bottom source/drain regions 312 and 112 (and 212 (FIG. 2B)) are formed by implanting semiconductor substrate 20. In accordance with some embodiments, semiconductor substrate 20 is a silicon substrate, a silicon germanium substrate, or a substrate formed of other semiconductor materials. Bottom source/drain regions 312 and 112 may be formed by implanting portions of semiconductor substrate 20 with an n-type impurity such as phosphorous or arsenic. Isolation regions such as Shallow Trench Isolation (STI) regions 22 are formed in substrate 20 to separate neighboring active regions. In accordance with some embodiments of the present disclosure, as shown in FIG. 1, STI regions 22 encircles the bottom source/drain regions of transistors 100, 200, 300, and 400, wherein portions of STI regions 22 may extend directly underlying local interconnectors 210 and 410 to form full rings.

FIG. 2B illustrates the formation of VGAA transistors 100 and 200, wherein the cross-sectional view is obtained from the plane containing line B-B in FIG. 1. The respective process step is shown as step 702 in the process flow shown in FIG. 12. The cross-sectional view illustrates a half of each of VGAA transistors 100 and 200. VGAA transistor 100 includes bottom source/drain region 112, which may be a source region or a drain region, depending on the function of the respective VGAA transistor 100. Silicide region 114 is formed at a top surface of bottom source/drain region 112, which may include a nickel silicide, a cobalt silicide, or the like. Bottom source/drain extension region 116 is formed over bottom source/drain region 112. Over bottom source/drain extension region 116 resides channel region 118. Top source/drain region 120 is over channel region 118, and is also an n-type region. Top source/drain region 120 may include a source/drain extension region, which is lightly doped, and/or a heavily doped source/drain region, wherein the source/drain extension region has a doping concentration lower than that of the heavily doped top source/drain region. In accordance with some embodiments of the present disclosure, bottom source/drain extension region 116, channel region 118, and top source/drain region 120 in combination form vertical nanowire 102.

VGAA transistor 200 includes bottom source/drain region 212, which may be a source region or a drain region, depending on the function of the respective VGAA transistor 200. Silicide region 214 is formed at a top surface of bottom source/drain region 212, which may include a nickel silicide, a cobalt silicide, or the like. Bottom source/drain extension region 216 is formed over bottom source/drain region 212. Over bottom source/drain extension region 216 resides channel region 218. Top source/drain region 220 is formed over channel region 218. Top source/drain region 220 may include a source/drain extension region, which is lightly doped, and/or a heavily doped source/drain region, wherein the source/drain extension region has a doping concentration lower than that of the heavily doped top source/drain region. In accordance with some embodiments of the present disclosure, bottom source/drain extension region 216, channel region 218, and top source/drain extension region 220 in combination form vertical nanowire 202. Bottom source/drain region 212 and top source/drain region 220 are p-type regions.

Nanowires 102 and 202 are formed of a semiconductor material, which may comprise SiGe or a III-V compound semiconductor such as InAs, GaSb, GaN, InP, GaAs, InSb, or InGaSb. Nanowires 102 and 202, including the respective bottom source/drain extension regions, channel regions, and top source/drain regions, may be formed by epitaxy.

Gate dielectrics 104 and 204 form rings encircling the respective channel regions 118 and 218, respectively. In accordance with some embodiments, each of gate dielectrics 104 and 204 includes a single dielectric layer. In alternative embodiments, each of gate dielectrics 104 and 204 includes more than one layer. Gate dielectrics 104 and 204 may be formed of high-k dielectric materials such as hafnium oxide, lanthanum oxide, aluminum oxide, zirconium oxide, or the like. Gate electrodes 106 and 206 encircle the respective gate dielectrics 104 and 204. Gate electrodes 106 and 206 may be metal gate electrodes, wherein the materials of gate electrodes 106 and 206 are selected according to the desirable work functions. For example, gate electrode 106 may have a low work function in the range between about 4.1 eV and about 4.5 eV, and gate electrode 206 may have a high work function in the range between about 4.5 eV and about 4.9 eV. Gate dielectrics 104 and 204 and some layers of metal gate electrodes 106 and 206 may have L-shapes in the cross-sectional view.

Dielectric regions 24, 26, and 28 are formed to separate the various conductive features including regions 106, 206, 112, 212, 114, 214, 118, and 218 from each other. Dielectric regions 24, 26, and 28 may be formed of silicon oxide, silicon nitride, silicon oxynitride, silicon oxycarbide, or the like.

As shown in FIG. 2A, gate dielectric 104 and some layers of metal gate electrode 106 may have horizontal portions extending to the cross-sectional view shown in FIG. 2A, wherein in these regions, gate dielectric 104 is over the respective bottom source/drain regions 112 and 212, respectively.

Figure 2C:
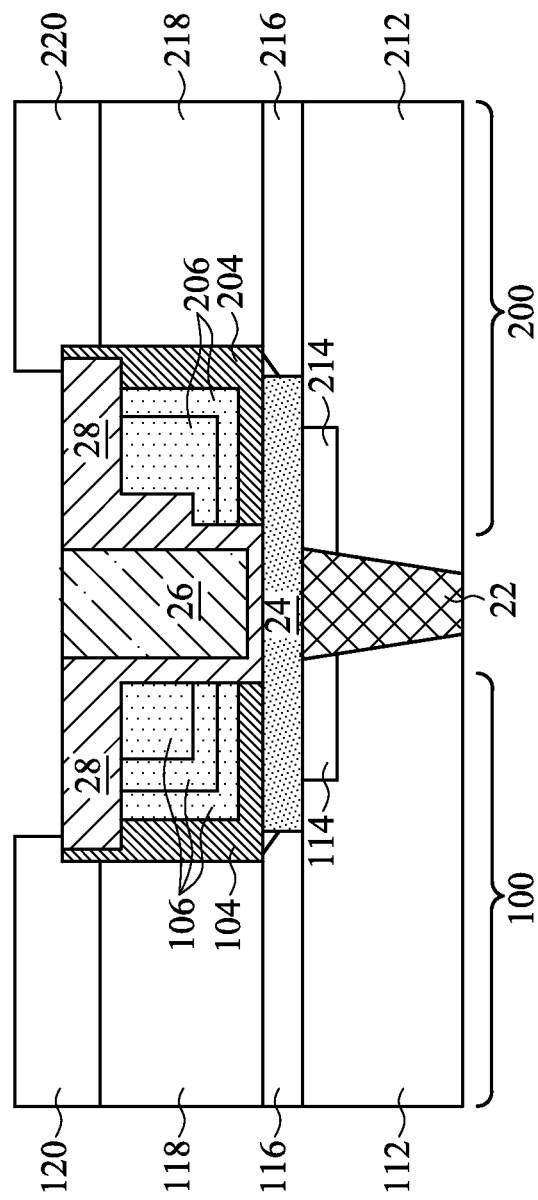

FIG. 2C illustrates a cross-sectional view of the initial structure, wherein the cross-sectional view is obtained from the plane containing line C-C in FIG. 1. The structure shown in FIG. 2C is similar to the structure shown in FIG. 2B in this step.

Figure 3A:
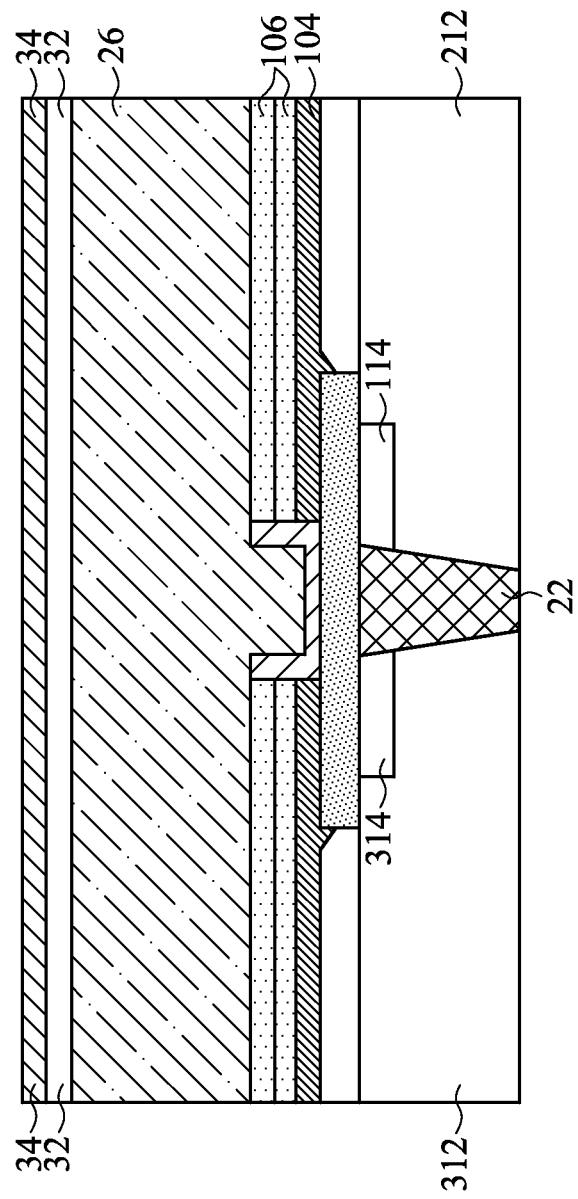
Figure 3B:
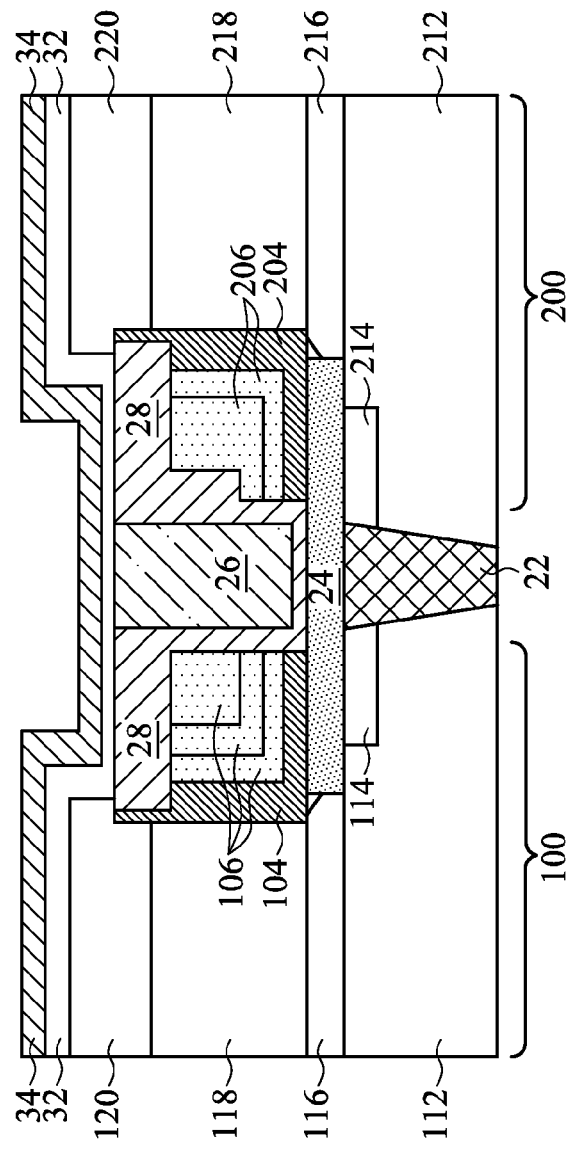
Figure 3C:
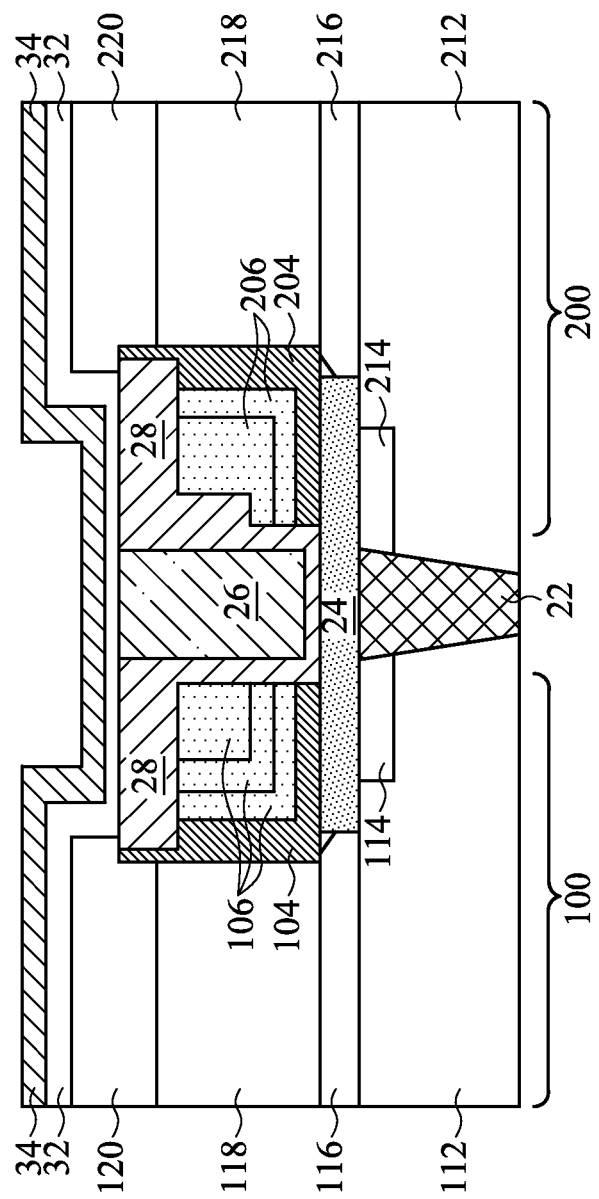

Next, referring to FIG. 3A, top source/drain silicide layer 32 is formed. The respective process step is shown as step 704 in the process flow shown in FIG. 12. In accordance with some embodiments of the present disclosure, top source/drain silicide layer 32 comprises titanium silicide, cobalt silicide, or the like, which may be formed through a deposition step. Alternatively, top source/drain silicide layer 32 is formed by depositing a silicon layer followed by siliciding the silicon layer. In accordance with some embodiments of the present disclosure, top source/drain silicide layer 32 continuously extends from directly over VGAA transistor 100 to directly over VGAA transistor 200. In accordance with alternative embodiments, top source/drain silicide layer 32 is formed as discrete regions, with each of the top source/drain regions 120 and 220 having one of the discrete silicide layer thereon, and the silicide layers over different VGAA transistors 100 and 200 are physically separated from each other.

Also shown in FIG. 3A is the formation of conductive barrier layer 34. The respective process step is shown as step 706 in the process flow shown in FIG. 12. In accordance with some embodiments, conductive barrier layer 34 comprises a titanium layer and a titanium nitride layer over the titanium layer. In accordance with alternative embodiments of the present disclosure, conductive barrier layer 34 comprises a tantalum layer and a tantalum nitride layer over the tantalum layer. Conductive barrier layer 34 may be formed by depositing a metallic layer such as titanium layer or a tantalum layer, and then nitridating a top portion of the metallic layer, leaving the bottom portion not nitridated. The deposition for forming conductive barrier layer 34 may include one of the chemical vapor deposition methods. Conductive barrier layer 34 extends to directly over both VGAA transistors 100 and 200, as also show in FIGS. 3B and 3C.

Figure 4A:
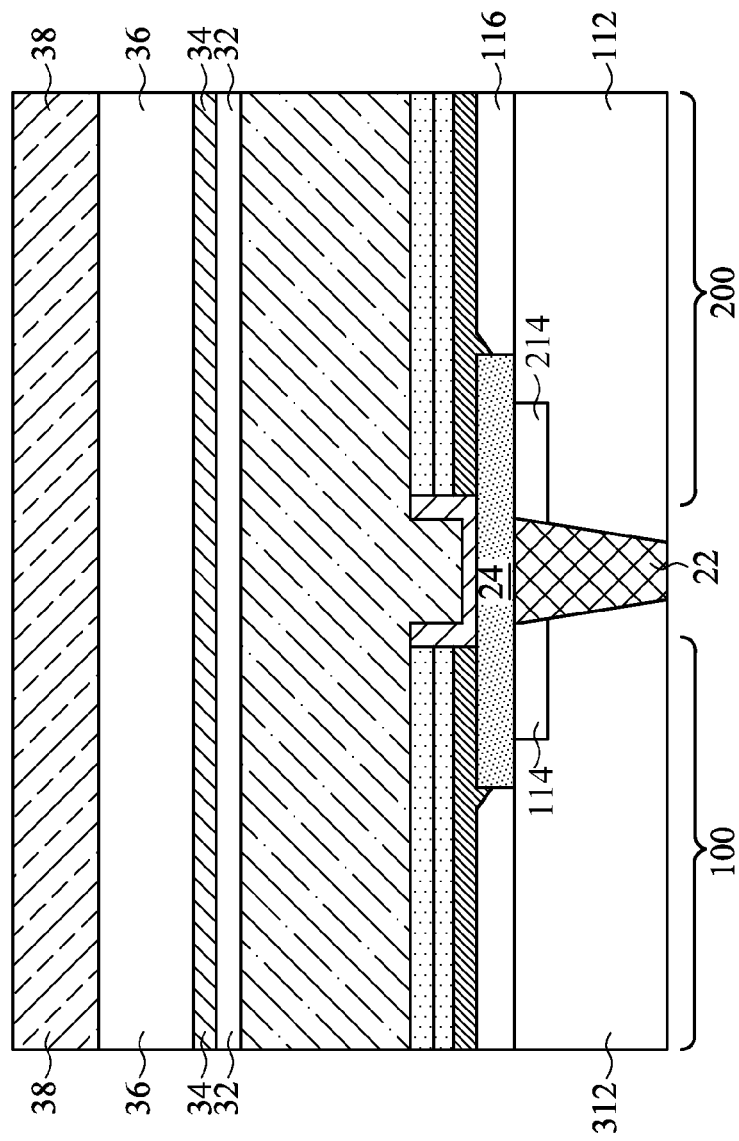
Figure 4B:
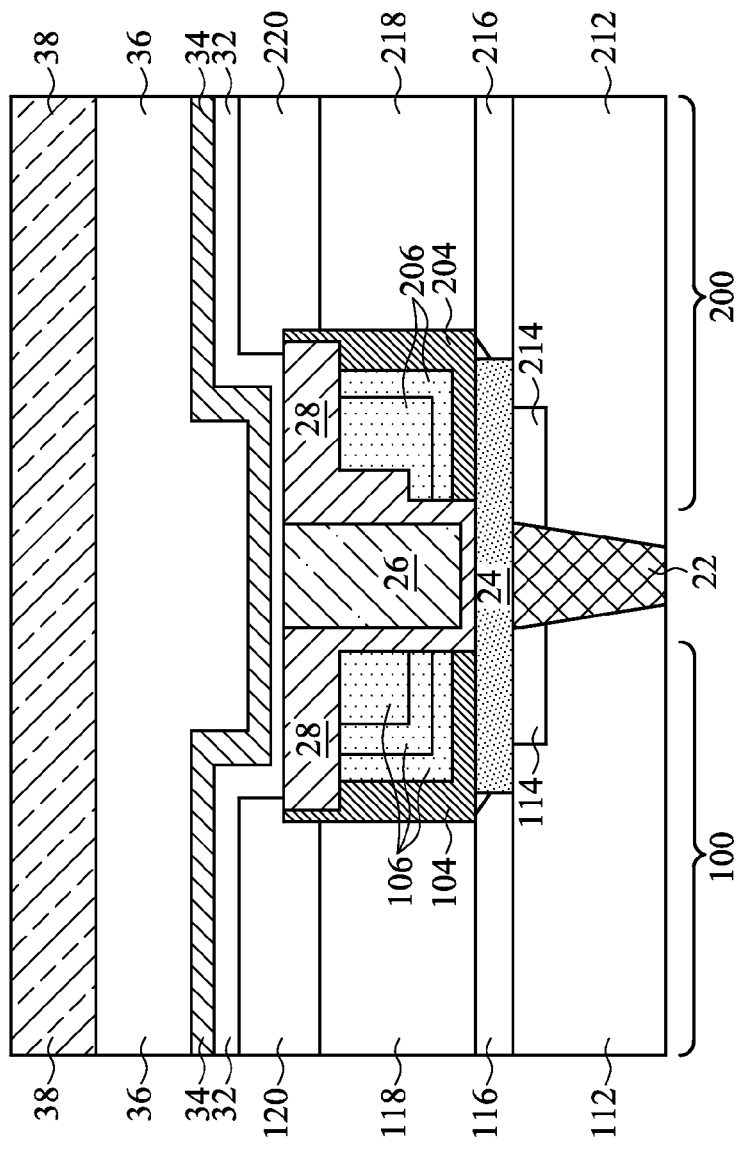
Figure 4C:
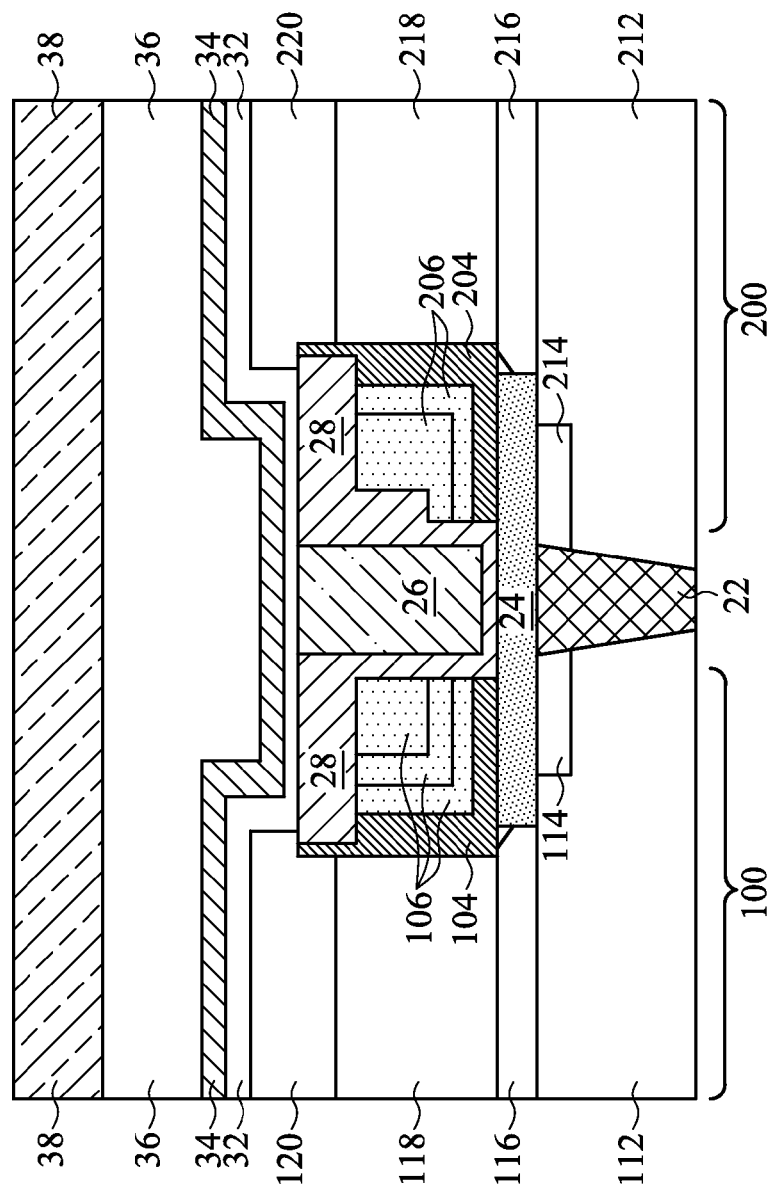

FIGS. 4A, 4B, and 4C illustrate the formation of top metal layer 36. The respective process step is shown as step 708 in the process flow shown in FIG. 12. In accordance with some embodiments of the present disclosure, top metal layer 36 is formed of tungsten, nickel, cobalt, aluminum, copper, alloys thereof, and/or composite layers thereof.

FIGS. 4A, 4B, and 4C further illustrate the formation of hard mask layer 38. The respective process step is shown as step 710 in the process flow shown in FIG. 12. Hard mask layer 38 may be formed of silicon nitride or other materials suitable for acting as etching masks. As shown in FIG. 4C, top metal layer 36 and hard mask layer 38 extend directly over VGAA transistors 100 and 200. As shown in FIGS. 4A and 4B, top metal layer 36 and hard mask layer 38 also extend directly over the portions of STI regions 22 and dielectric region 26 (FIG. 4C) that separate VGAA transistors 100 and 200 from each other.

Figure 5A:
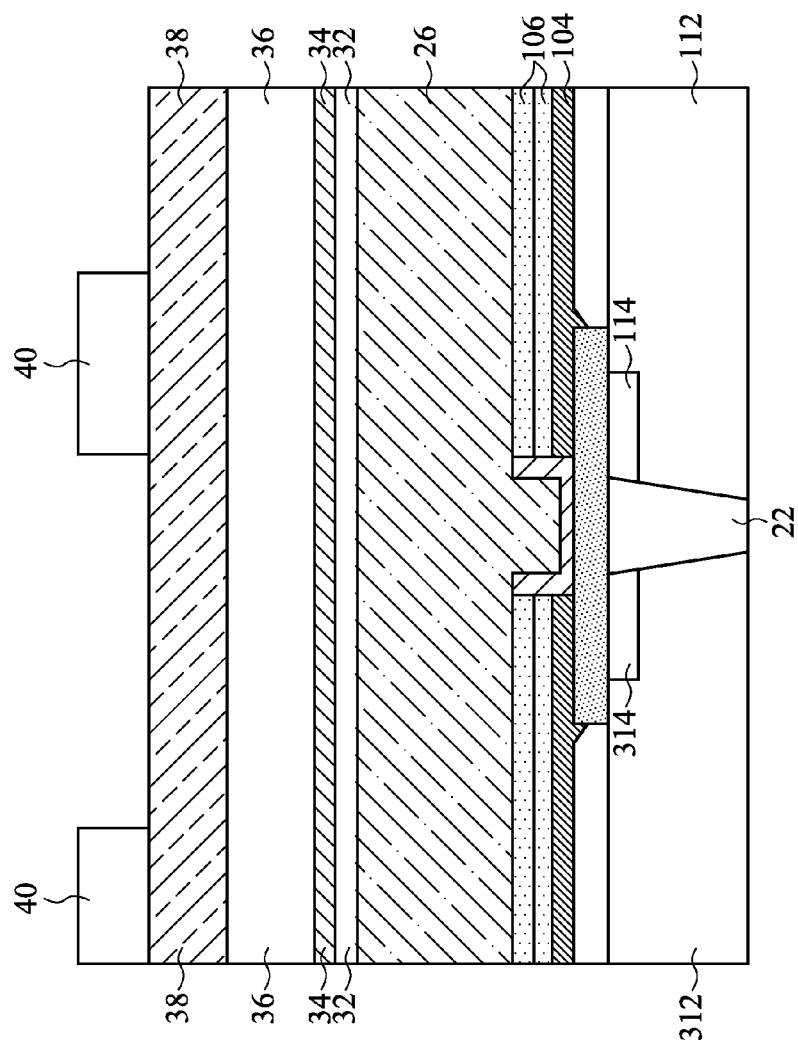
Figure 5B:
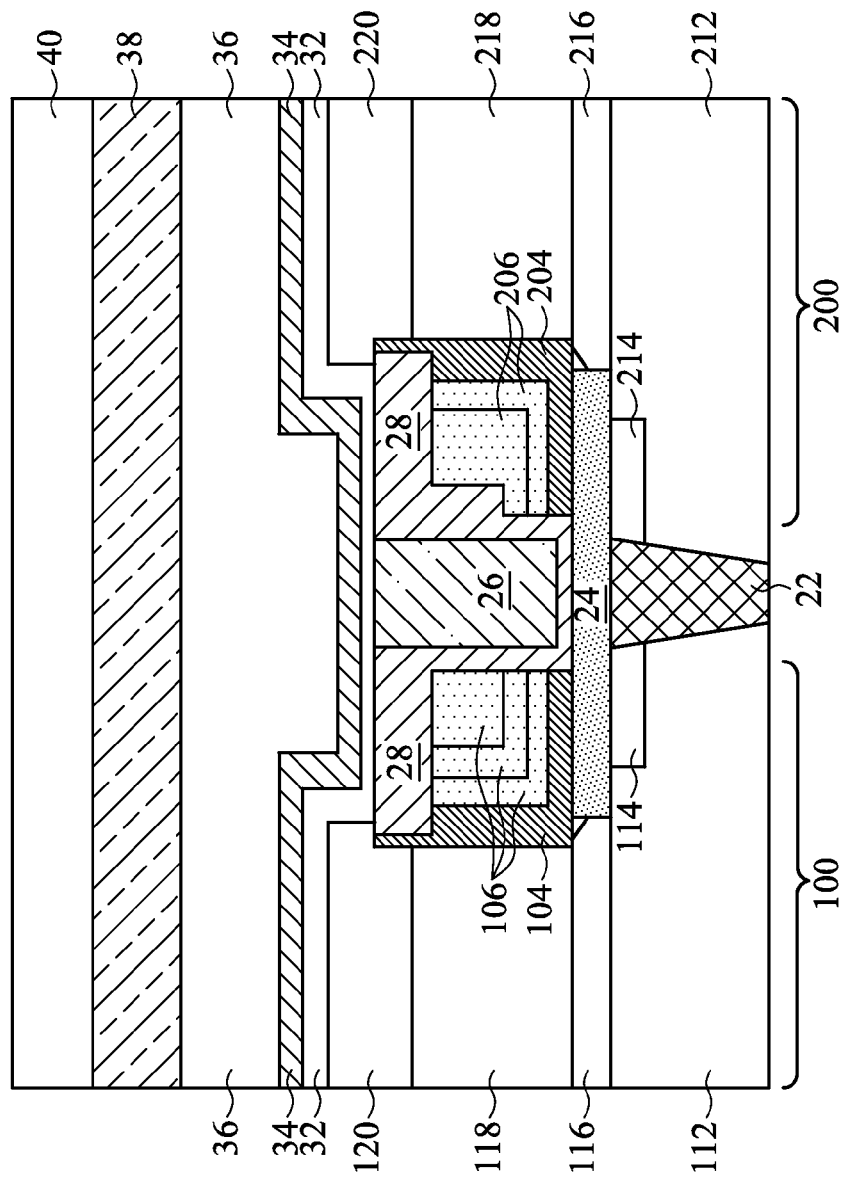
Figure 5C:
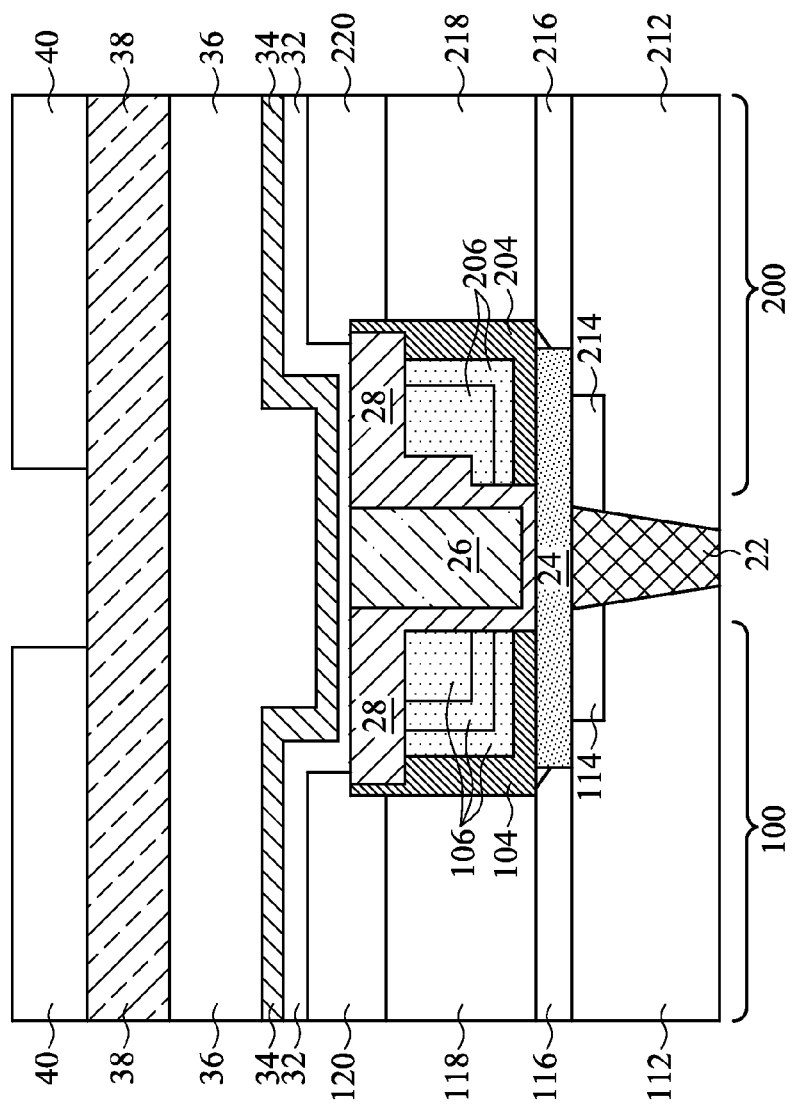
Figure 6A:
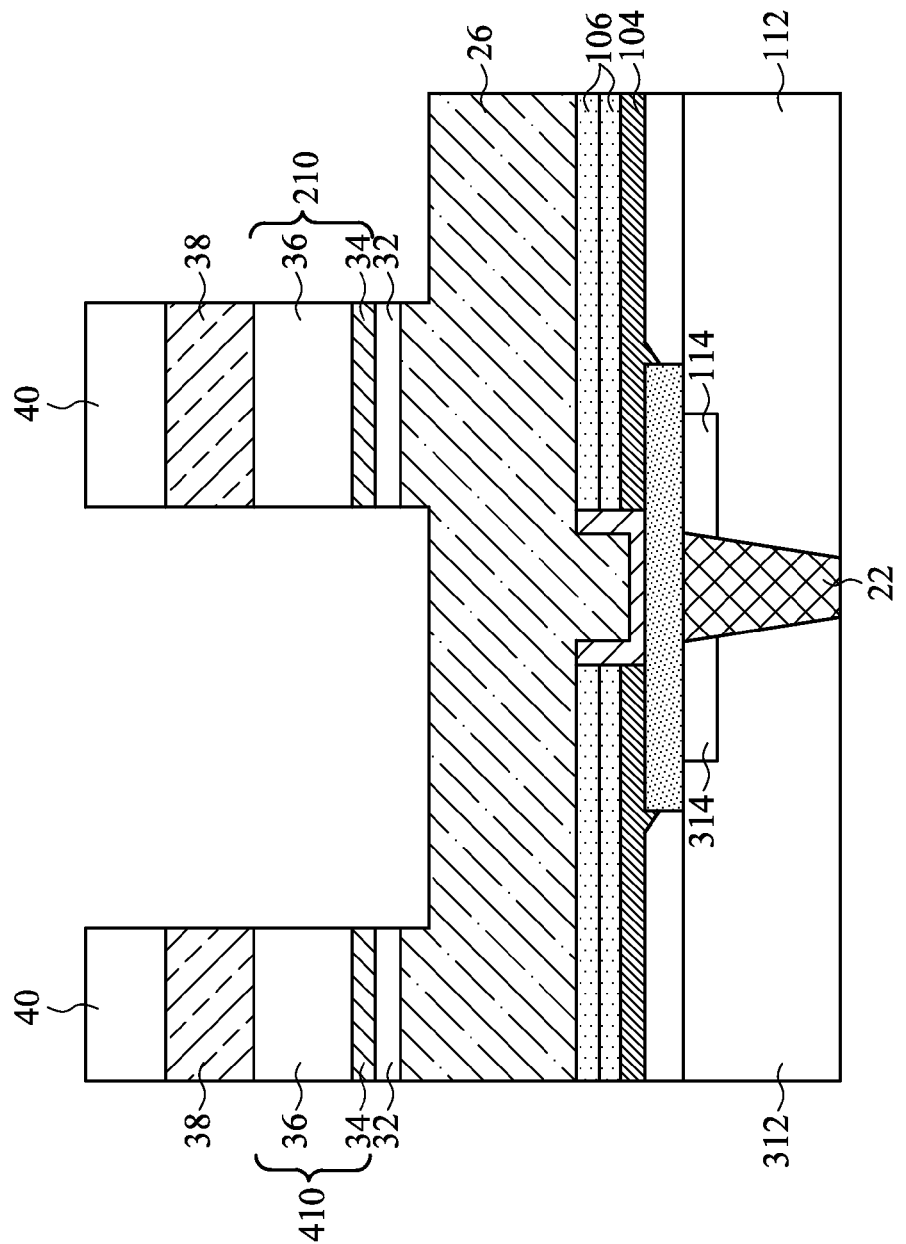
Figure 6B:
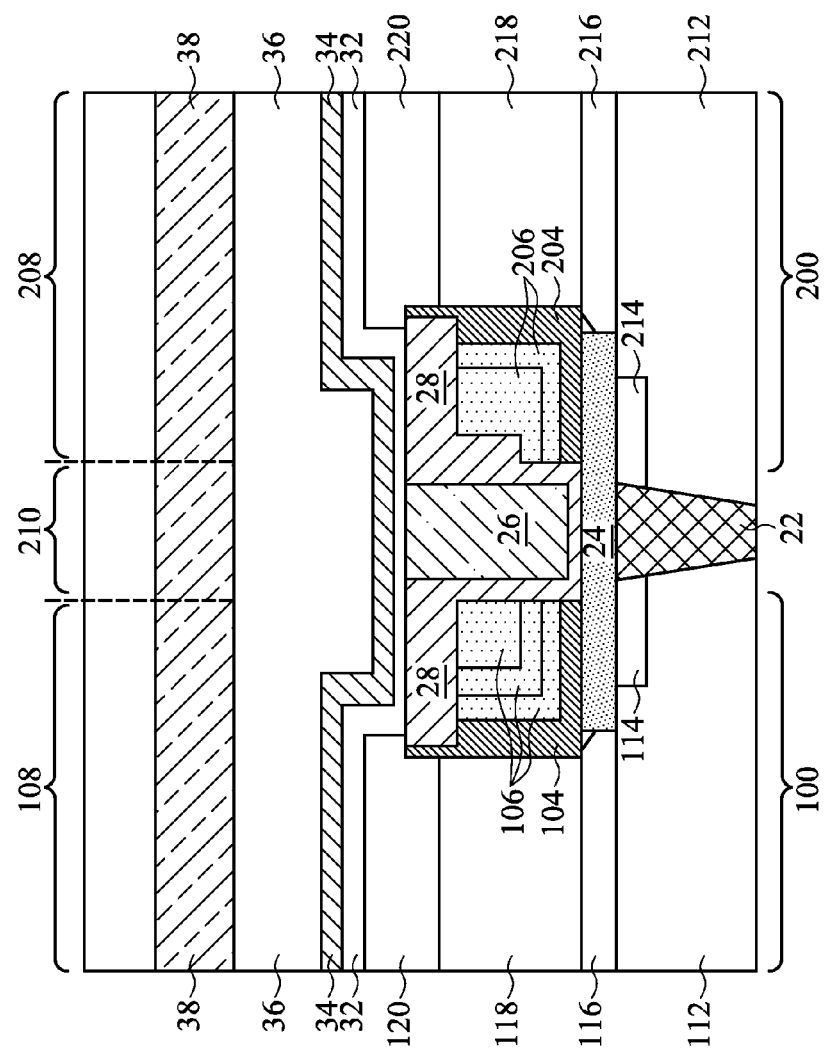
Figure 6C:
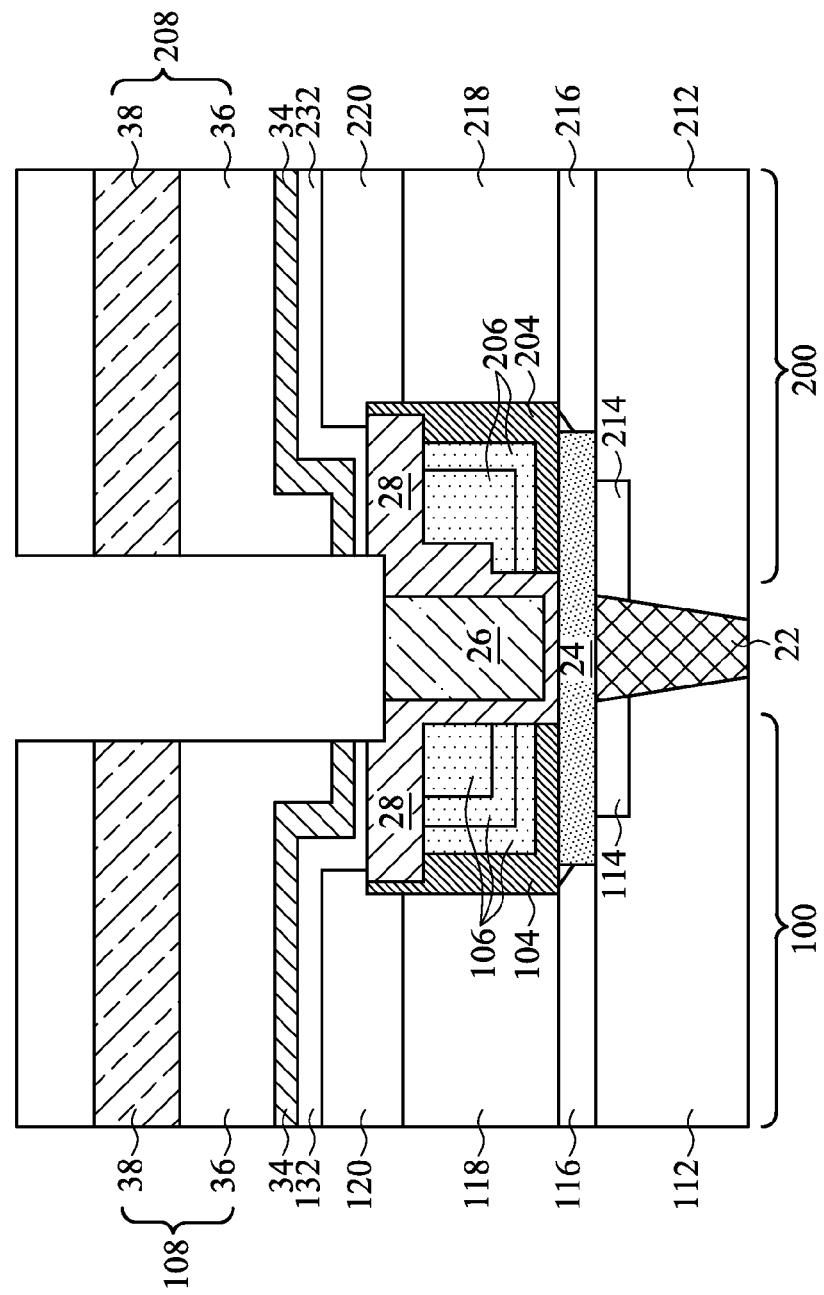

Next, as shown in FIGS. 5A, 5B, and 5C and FIGS. 6A, 6B, and 6C, a patterning step is performed to pattern the conductive features 32, 34, and 36. Referring to FIGS. 5A, 5B, and 5C, photo resist 40 is formed (applied) and patterned in an exposure and development step. Next, the patterned photo resist 40 is used to pattern the underlying hard mask layer 38. The respective process step is shown as step 712 in the process flow shown in FIG. 12. The patterned hard mask layer 38 is further used to pattern the underlying conductive layers including top metal layer 36, conductive barrier layer 34, and top source/drain silicide layer 32. The respective process step is shown as step 714 in the process flow shown in FIG. 12. The resulting structure is shown in FIGS. 6A, 6B, and 6C. In accordance with some embodiments, the patterning is stopped after an underlying dielectric layer such as dielectric regions 26 is exposed.

FIG. 6C illustrates a cross-sectional view of the structure after the patterning step, wherein the cross-sectional view is obtained from the plane containing line C-C in FIG. 1. After the patterning step, hard mask layer 38 is removed. Photo resist 40, if remaining after the patterning step, will also be removed. As shown in FIG. 6C, some portions of top metal layer 36 and conductive barrier layer 34 directly over top source/drain region 120 remain after the patterning, and form top source/drain pad 108. Top source/drain pad 108 is electrically coupled to top source/drain region 120 through top source/drain silicide region 132, which is a remaining portion of top silicide layer 32. The remaining portions of top metal layer 36 and conductive barrier layer 34 directly over top source/drain region 220 also form top source/drain pad 208. Top source/drain pad 208 is electrically coupled to top source/drain region 220 through top source/drain silicide region 232, which is also a remaining portion of top silicide layer 32.

Referring to FIG. 6B, which is obtained from the same plane that contains line B-B in FIG. 1, portions of top metal layer 36 and conductive barrier layer 34 are left after the patterning to form local interconnector 210, which electrically connects top source/drain pad 108 to top source/drain pad 208. As shown in FIG. 1, local interconnector 210 may be narrower than top source/drain pads 108 and 208. Since local interconnector 210 is formed in the same process steps as the formation of top source/drain pads 108 and 208, local interconnector 210 and top source/drain pads 108 and 208 are continuously connected to form a continuous conductive region, wherein no distinguishable interface is formed between them. Also, local interconnector 210 and top source/drain pads 108 and 208 are formed of the same materials, have same number of sub-layers, and with the corresponding sub-layers formed of the same homogenous conductive materials.

FIG. 6A illustrates a cross-sectional view of the structure after the patterning step, wherein the cross-sectional view is obtained from the plane containing line A-A in FIG. 1. FIG. 6A illustrates both local interconnectors 210 and 410 (also refer to FIG. 1), which are separated from each other.

Figure 7A:
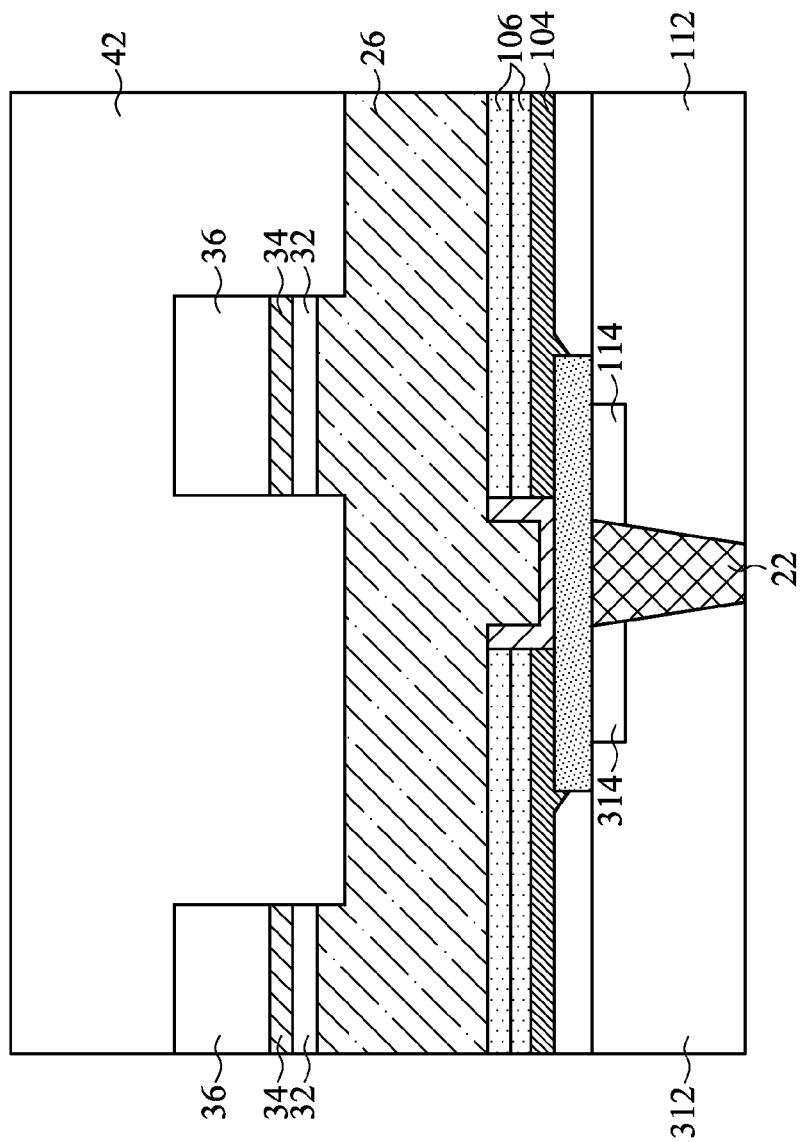
Figure 7B:
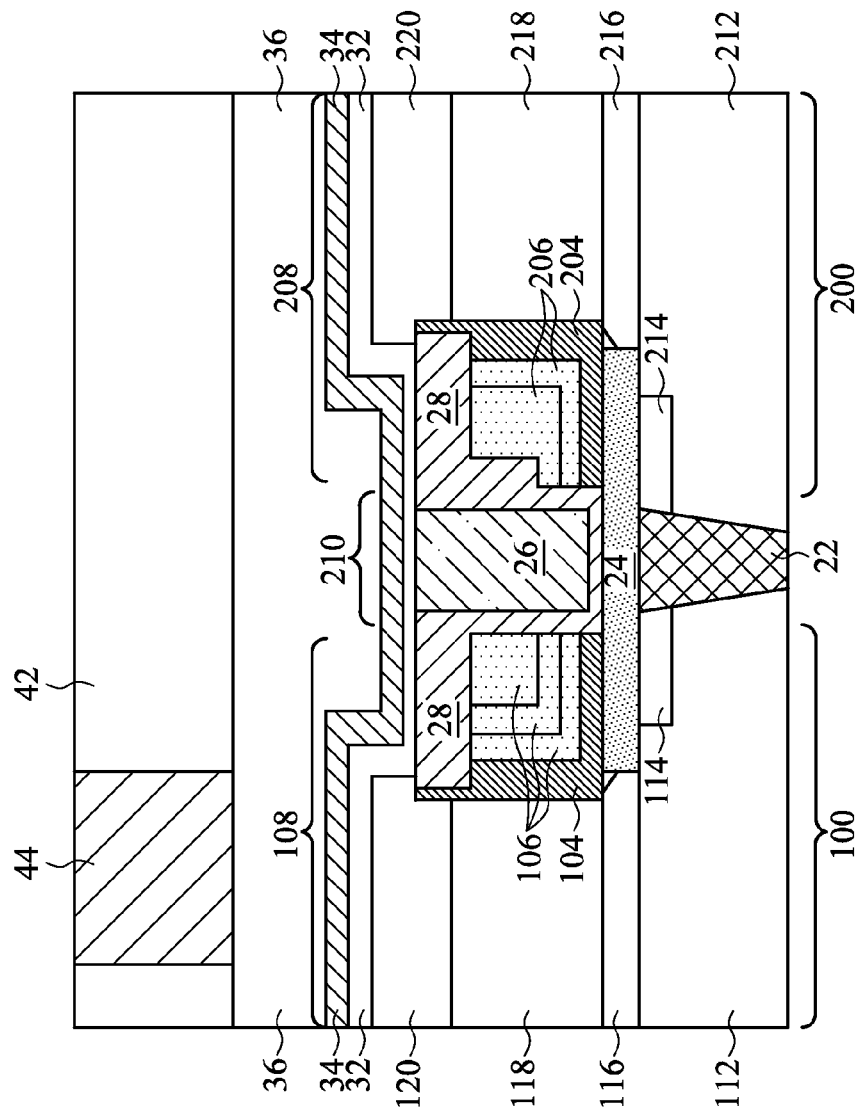
Figure 7C:
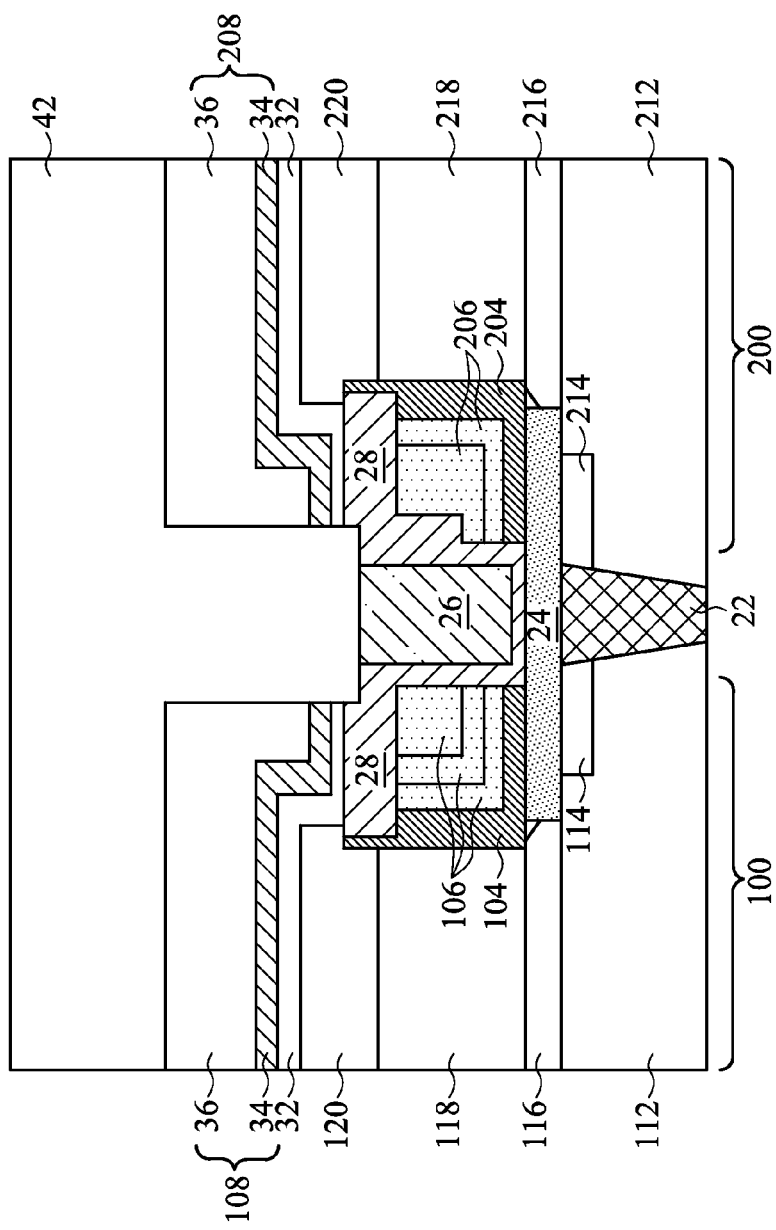

FIGS. 7A, 7B, and 7C illustrate the formation of dielectric layer 42 and conductive feature 44 (FIG. 7B). The respective process step is shown as step 716 in the process flow shown in FIG. 12. In accordance with some embodiments of the present disclosure, dielectric layer 42 is an Inter-Layer Dielectric (ILD), which may comprise a Flowable oxide formed using, for example, Flowable Chemical Vapor Deposition (FCVD). ILD 42 may also include Phospho-Silicate glass (PSG), Boro-Silicate Glass (BSG), Boron-Doped Phospho-Silicate Glass (BPSG), Tetra Ethyl Ortho Silicate (TEOS) oxide, or the like. A planarization such as a Chemical Mechanical Polish (CMP) step may be performed to level the top surfaces of ILD 42.

Conductive feature 44 (FIG. 7B) is formed in dielectric layer 42. In accordance with some embodiments of the present disclosure, conductive feature 44 is a metal line in the bottom metallization layer, which may comprise copper, and may be formed using a damascene process. In alternative embodiments, conductive feature 44 is a contact plug or a conductive via, which may also comprise tungsten, cobalt, aluminum, nickel, copper, or the like. Conductive feature 44 is formed directly over one of top source/drain pads 108 and 208, and hence is electrically connected to both top source/drain pads 108 and 208 through local interconnector 210 (FIG. 7B).

Figure 8:
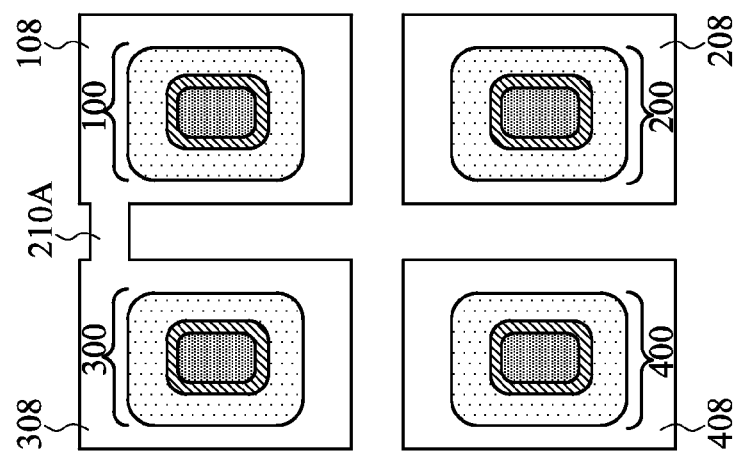

FIGS. 8 through 11 illustrate local interconnectors interconnecting the top source/drain pads of neighboring VGAA transistors in accordance with various exemplary embodiments. Referring to FIG. 8, top source/drain pad 108 of n-type VGAA transistor 100 and top source/drain pad 308 of n-type VGAA transistor 300 are interconnected through local interconnector 210A, which is formed simultaneously as top source/drain pads 108, 208, 308, and 408. In accordance with alternative embodiments (not shown), local interconnector 210A may also be formed to interconnect the top source/drain pads of two p-type VGAA transistors such as transistors 200 and 400. Local interconnector 210A is formed simultaneously as top source/drain pads 108, 208, 308, and 408.

Figure 9:
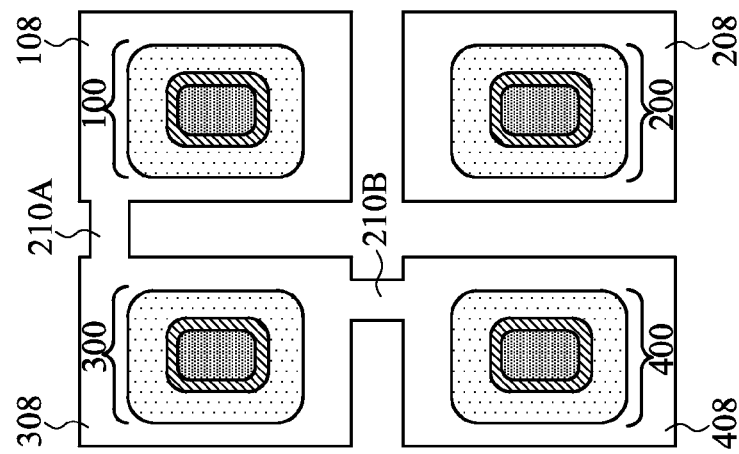
FIGS. 8 through 11 illustrate some exemplary local interconnectors of VGAA transistors in accordance with some embodiments.

In FIG. 9, top source/drain pad 108 of n-type VGAA transistor 100 and top source/drain pad 308 of n-type VGAA transistor 300 are interconnected through local interconnector 210A. Top source/drain pad 308 of n-type VGAA transistor 300 and top source/drain pad 408 of p-type VGAA transistors 400 are further interconnected through local interconnector 210B. Local interconnectors 210A and 210B are formed simultaneously as top source/drain pads 108, 208, 308, and 408.

Figure 10:
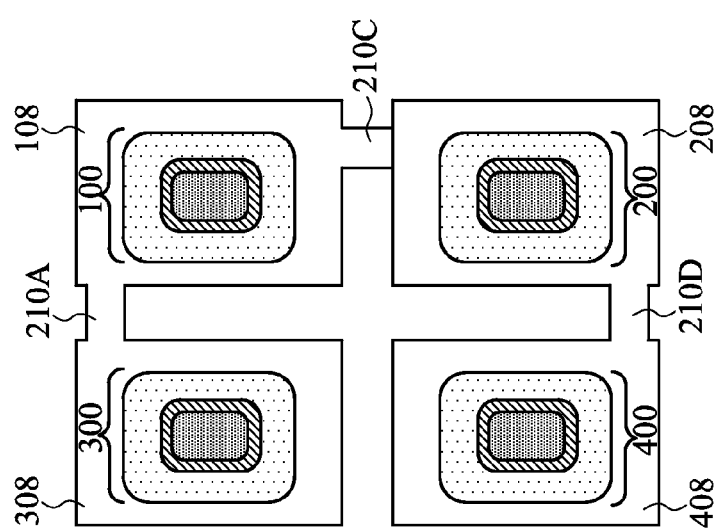

In FIG. 10, top source/drain pad 108 of n-type VGAA transistor 100 and top source/drain pad 308 of n-type VGAA transistor 300 are interconnected through local interconnector 210A. Top source/drain pad 108 of n-type VGAA transistor 100 and top source/drain pad 208 of p-type VGAA transistors 200 are further interconnected through local interconnector 210C. In addition, top source/drain pad 208 of p-type VGAA transistor 200 and top source/drain pad 408 of p-type VGAA transistor 400 are interconnected through local interconnector 210D. Local interconnectors 210A, 210C, and 210D are formed simultaneously as top source/drain pads 108, 208, 308, and 408.

Figure 11:
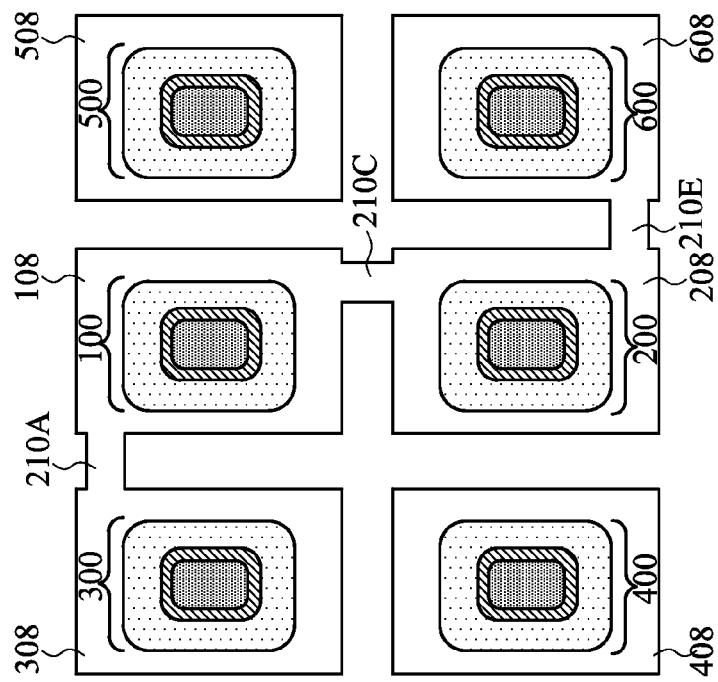

FIG. 11 illustrates the top view of n-type VGAA transistors 100, 300, and 500, and p-type VGAA transistors 200, 400, and 600 formed close to each other. Top source/drain pad 108 of n-type VGAA transistor 100 and top source/drain pad 308 of n-type VGAA transistor 300 are interconnected through local interconnector 210A. Top source/drain pad 108 of n-type VGAA transistor 100 and top source/drain pad 208 of p-type VGAA transistors 200 are further interconnected through local interconnector 210C. In addition, top source/drain pad 208 of p-type VGAA transistor 200 and top source/drain pad 608 of p-type VGAA transistor 600 are interconnected through local interconnector 210E. Local interconnectors 210A, 210C, and 210E are formed simultaneously as top source/drain pads 108, 208, 308, 408, 508, and 608.

The embodiments of the present disclosure have some advantageous features. In conventional structures, the interconnection of the top source/drain regions (or pads) of neighboring VGAA transistors are made through forming contact plugs and metal lines. Accordingly, due to the contact resistance at the interfaces between contact plugs and metal lines, the resistance of the local interconnectors is high. Furthermore, more process steps and higher manufacturing cost are involved. In the embodiments of the present disclosure, the top source/drain pads and local interconnectors are formed as a continuous region, and hence the contact resistance at the interface in conventional local interconnectors is eliminated. In addition, the processes are simplified due to the reduced process steps.

In accordance with some embodiments of the present disclosure, an integrated circuit structure includes a first vertical transistor and a second vertical transistor. The first vertical transistor includes a first semiconductor channel, a first top source/drain region over the first semiconductor channel, and a first top source/drain pad overlapping the first top source/drain region. The second vertical transistor includes a second semiconductor channel, a second top source/drain region over the second semiconductor channel, and a second top source/drain pad overlapping the second top source/drain region. A local interconnector interconnects the first top source/drain pad and the second top source/drain pad. The first top source/drain pad, the second top source/drain pad, and the local interconnector are portions of a continuous region, with no distinguishable interfaces between the first top source/drain pad, the second top source/drain pad, and the local interconnector.

In accordance with alternative embodiments of the present disclosure, an integrated circuit structure includes a first vertical transistor and a second vertical transistor. The first vertical transistor includes a first semiconductor channel, a first top source/drain region over the first semiconductor channel, a first gate dielectric encircling the first semiconductor channel, and a first gate electrode encircling the first gate dielectric. The second vertical transistor includes a second semiconductor channel, a second top source/drain region over the second semiconductor channel, a second gate dielectric encircling the second semiconductor channel, and a second gate electrode encircling the second gate dielectric. A dielectric region is located between and separating the first gate electrode and the second gate electrode from each other. The integrated circuit structure further includes a conductive feature including a first portion having a first bottom surface contacting a top surface of the first top source/drain region, a second portion having a second bottom surface contacting a top surface of the second top source/drain region, and a third portion having a third bottom surface contacting a top surface of the dielectric region, wherein the third portion interconnects the first portion and the second portion.

In accordance with yet alternative embodiments of the present disclosure, a method includes forming a first vertical transistor including a first semiconductor channel and a first top source/drain region over the first semiconductor channel, and forming a second vertical transistor including a second semiconductor channel and a second top source/drain region over the second semiconductor channel. A conductive layer is formed over the first vertical transistor and the second vertical transistor and the region between the first vertical transistor and the second vertical transistor. The conductive layer is patterned, wherein remaining portions of the conductive layer includes a first portion having a first bottom surface contacting a top surface of the first top source/drain region, a second portion having a second bottom surface contacting a top surface of the second top source/drain region, and a third portion interconnecting the first portion and the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first vertical transistor comprising:
      a first semiconductor channel;
      a first top source/drain region over the first semiconductor channel; and
      a first top source/drain pad overlapping the first top source/drain region;
   a second vertical transistor comprising:
      a second semiconductor channel;
      a second top source/drain region over the second semiconductor channel; and
      a second top source/drain pad overlapping the second top source/drain region; and
   a local interconnector interconnecting the first top source/drain pad and the second top source/drain pad, wherein the first top source/drain pad, the second top source/drain pad, and the local interconnector are portions of a continuous region, with no distinguishable interfaces between the first top source/drain pad, the second top source/drain pad, and the local interconnector.

2. The integrated circuit structure of claim 1, wherein each of the local interconnector, the first top source/drain pad, and the second top source/drain pad comprises a conductive barrier layer and a top metal layer over the conductive barrier layer.

3. The integrated circuit structure of claim 2 further comprising a metal silicide layer underlying and contacting each of the local interconnector, the first top source/drain pad, and the second top source/drain pad.

4. The integrated circuit structure of claim 1, wherein the first vertical transistor and the second vertical transistor are of opposite conductivity types.

5. The integrated circuit structure of claim 1, wherein the first vertical transistor and the second vertical transistor are of a same conductivity type.

6. The integrated circuit structure of claim 1, wherein the first top source/drain pad and the second top source/drain pad are wider than the local interconnector.

7. The integrated circuit structure of claim 1 further comprising:
   a first gate dielectric encircling the first semiconductor channel;
   a first gate electrode encircling the first gate dielectric;
   a second gate dielectric encircling the second semiconductor channel; and
   a second gate electrode encircling the second gate dielectric.

8. An integrated circuit structure comprising:
   a first vertical transistor comprising:
      a first semiconductor channel;
      a first top source/drain region over the first semiconductor channel;
      a first gate dielectric encircling the first semiconductor channel; and
      a first gate electrode encircling the first gate dielectric;
   a second vertical transistor comprising:
      a second semiconductor channel;
      a second top source/drain region over the second semiconductor channel;
      a second gate dielectric encircling the second semiconductor channel; and
      a second gate electrode encircling the second gate dielectric;
   a dielectric region between and separating the first gate electrode and the second gate electrode from each other; and
   a conductive feature comprising:
      a first portion having a first bottom surface contacting a top surface of the first top source/drain region;
      a second portion having a second bottom surface contacting a top surface of the second top source/drain region; and
      a third portion having a third bottom surface contacting a top surface of the dielectric region, wherein the third portion interconnects the first portion and the second portion.

9. The integrated circuit structure of claim 8, wherein the conductive feature comprises a silicide layer, with the first bottom surface, the second bottom surface, and the third bottom surface being bottom surfaces of the silicide layer.

10. The integrated circuit structure of claim 9, wherein the conductive feature further comprises a conductive barrier layer over and electrically connected to the silicide layer, with the conductive barrier layer and the silicide layer being co-terminus.

11. The integrated circuit structure of claim 9, wherein the conductive feature further comprises a top metal layer over and electrically connected to the silicide layer, with the top metal layer and the silicide layer being co-terminus.

12. The integrated circuit structure of claim 8, wherein the first vertical transistor and the second vertical transistor are of opposite conductivity types.

13. The integrated circuit structure of claim 8, wherein the first vertical transistor and the second vertical transistor are of a same conductivity type.

14. The integrated circuit structure of claim 8, wherein the conductive feature overlaps an entirety of the first semiconductor channel and an entirety of the second semiconductor channel.

15. A method comprising:
   forming a first vertical transistor comprising:
      a first semiconductor channel; and
      a first top source/drain region over the first semiconductor channel;
   forming a second vertical transistor comprising:
      a second semiconductor channel; and
      a second top source/drain region over the second semiconductor channel;
   forming a conductive layer over the first vertical transistor and the second vertical transistor and a region between the first vertical transistor and the second vertical transistor; and
   patterning the conductive layer, wherein remaining portions of the conductive layer comprise:
      a first portion having a first bottom surface contacting a top surface of the first top source/drain region;

a second portion having a second bottom surface contacting a top surface of the second top source/drain region; and a third portion interconnecting the first portion and the second portion.

16. The method of claim 15 further comprising:

forming a dielectric region between and separating the first vertical transistor and the second vertical transistor from each other, wherein the third portion of the remaining portions of the conductive layer has a bottom surface contacting the dielectric region.

17. The method of claim 15, wherein the forming the conductive layer comprises:

blanket forming a conductive barrier layer; and blanket forming a top metal layer over the conductive barrier layer, wherein the conductive barrier layer and the top metal layer are both patterned in the patterning.

18. The method of claim 17, wherein the forming the conductive layer further comprises:

before the blanket forming the conductive barrier layer, forming a silicide layer over the first vertical transistor and the second vertical transistor.

19. The method of claim 15, wherein the first vertical transistor and the second vertical transistor are of opposite conductivity types.

20. The method of claim 15, wherein the first vertical transistor and the second vertical transistor are of a same conductivity type.

* * * * *